United States Patent
Kuo et al.

(10) Patent No.: US 9,473,157 B2
(45) Date of Patent: Oct. 18, 2016

(54) FREQUENCY SYNTHESIZER WITH INJECTION PULLING/PUSHING SUPPRESSION/MITIGATION AND RELATED FREQUENCY SYNTHESIZING METHOD THEREOF

(71) Applicant: MEDIATEK INC., Hsin-Chu (TW)

(72) Inventors: Chun-Ming Kuo, Hsinchu (TW); Chii-Horng Chen, Hsinchu County (TW); Shih-Chi Shen, New Taipei (TW); Ai-Hsuan Liu, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 61 days.

(21) Appl. No.: 14/339,459

(22) Filed: Jul. 24, 2014

(65) Prior Publication Data

US 2016/0028411 A1 Jan. 28, 2016

(51) Int. Cl.
*H03L 7/16* (2006.01)
*G04F 10/00* (2006.01)
*H03L 7/099* (2006.01)
*H03L 7/107* (2006.01)

(52) U.S. Cl.
CPC ........... *H03L 7/16* (2013.01); *G04F 10/005* (2013.01); *H03L 7/099* (2013.01); *H03L 7/1075* (2013.01); *H03L 2207/50* (2013.01)

(58) Field of Classification Search
CPC ......... H03L 7/081; H03L 7/085; H03L 7/10; H03L 7/02; H03L 7/07; H03L 7/099; G04L 10/005; G04L 10/00; G04L 10/06
USPC ......... 327/156, 158, 161; 375/371, 375, 376
See application file for complete search history.

(56) References Cited

U.S. PATENT DOCUMENTS

| | | | | |
|---|---|---|---|---|
| 5,703,539 | A | * 12/1997 | Gillig | H03L 7/107 331/16 |
| 2009/0052508 | A1 | * 2/2009 | Takahashi | H03L 7/085 375/219 |
| 2011/0156783 | A1 | * 6/2011 | Pavlovic et al. | H03L 7/081 327/159 |

OTHER PUBLICATIONS

Hsu, A Low-Noise Wide-BW 3.6-GHz Digital Delta-Sigma Fractional-N Frequency Synthesizer With a Noise-Shaping Time-to-Digital Converter and Quantization Noise Cancellation, IEEE Journal of Solid-State Circuits, vol. 43, No. 12, pp. 2776-2786, Dec. 2008.

Hsiao, Design of a Direct Conversion Transmitter to Resist Combined Effects of Power Amplifier Distortion and Local Oscillator Pulling, IEEE Transactions on Microwave Theory and Techniques, vol. 60, No. 6, pp. 2000-2009, Jun. 2012.

* cited by examiner

*Primary Examiner* — John Poos
(74) *Attorney, Agent, or Firm* — Winston Hsu; Scott Margo (57) ABSTRACT

A frequency synthesizer includes a phase-locked loop (PLL) and a loop bandwidth controller. The PLL generates an output clock according to a reference clock. The loop bandwidth controller checks at least one indicator indicative of injection pulling/pushing of the PLL to configure a loop bandwidth of the PLL. In one exemplary design, the loop bandwidth controller sets the loop bandwidth of the PLL by controlling a configuration of a loop filter included in the PLL. For example, the PLL is an all-digital phase-locked loop (ADPLL), and the loop filter is a digital loop filter of the ADPLL.

20 Claims, 5 Drawing Sheets

FIG. 6 ant invention, a frequency synthesizer with injection pulling/
FREQUENCY SYNTHESIZER WITH INJECTION PULLING/PUSHING SUPPRESSION/MITIGATION AND RELATED FREQUENCY SYNTHESIZING METHOD THEREOF

BACKGROUND

The disclosed embodiments of the present invention relate to generating an output clock according to a reference clock, and more particularly, to a frequency synthesizer with injection pulling/pushing suppression/mitigation and a related frequency synthesizing method thereof.

Frequency synthesizers are commonly used in a variety of electronic devices. Taking a conventional wireless communications system for example, a radio-frequency (RF) phase-locked loop (PLL) may be used as a frequency synthesizer to generate an RF clock to a following transmitter component according to a baseband reference clock. However, due to certain factors, the RF PLL may suffer from injection pulling/pushing to generate a disturbed RF clock. For one example, concerning the same transceiver, the RF PLL and a power amplifier (PA) may be placed in locations close to each other. As a result, the high-power RF signal generated from the PA may be injected into a controllable oscillator of the RF PLL, thus interfering with the clock frequency of the RF clock generated from the RF PLL. For another example, concerning a case where an electronic device employs a multi-RF design such as DSDA (Dual SIM Dual Active), carrier aggregation (CA), or IDC (In-Device Coexistence), multiple RF systems may be placed in locations close to each other. As a result, the output signal generated from at least one of the RF PLL and the PA of a second RF system may be injected into a controllable oscillator of the RF PLL in a first RF system, thus interfering with the clock frequency of the RF clock generated from the RF PLL in the first RF system.

SUMMARY

In accordance with exemplary embodiments of the present invention, a frequency synthesizer with injection pulling/pushing suppression/mitigation and a related frequency synthesizing method thereof are proposed to solve the above-mentioned problem.

According to a first aspect of the present invention, an exemplary frequency synthesizer is disclosed. The exemplary frequency synthesizer includes a phase-locked loop (PLL) and a loop bandwidth controller. The PLL is configured to generate an output clock according to a reference clock. The loop bandwidth controller is configured to check at least one indicator indicative of injection pulling/pushing of the PLL to configure a loop bandwidth of the PLL.

According to a second aspect of the present invention, an exemplary frequency synthesizing method is disclosed. The frequency synthesizing method includes: checking at least one indicator indicative of injection pulling/pushing of a phase-locked loop (PLL) for configuring a loop bandwidth of the PLL; and utilizing the PLL to generate an output clock according to a reference clock.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The key idea of the present invention is to adaptively adjust a loop bandwidth of a phase-clocked loop (PLL) in response to at least one indicator of injection pulling/pushing of the PLL. In this way, the injection pulling/pushing introduced noise of a controllable oscillator in the PLL may be filtered out by an adaptive setting of the loop bandwidth of the PLL (also known as PLL bandwidth). In one exemplary design, adaptive digital techniques may be employed to adjust the loop bandwidth of the PLL, thereby relaxing the analog requirement for injection pulling/pushing suppression/mitigation. Further details of the proposed injection pulling/pushing suppression/mitigation design are described as below.

Figure 1:
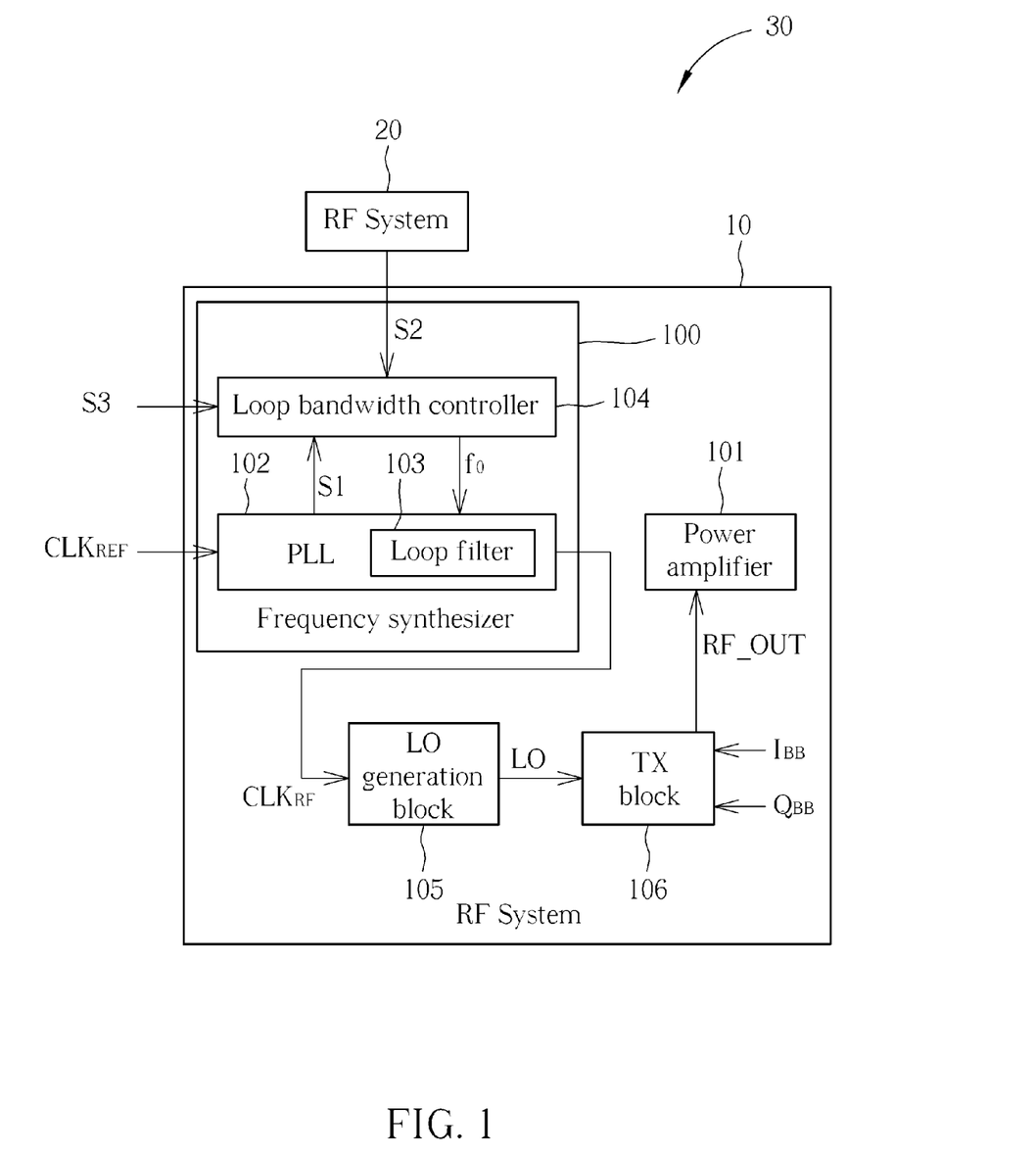
FIG. 1 is a diagram illustrating an electronic device according to an embodiment of the present invention.

FIG. 1 is a diagram illustrating an electronic device according to an embodiment of the present invention. By way of example, but not limitation, the electronic device 30 may be a wireless communications device such as a mobile phone, tablet, wearable device, etc. Hence, the electronic device 30 may use a frequency synthesizer 100 to generate a desired clock signal for a communications task. In this embodiment, the frequency synthesizer 100 may be part of a radio-frequency (RF) system 10. In some embodiments, the RF system 10 may comply with a first wireless communications specification such as the third generation (3G) of mobile telecommunications technology, the fourth generation (4G) of mobile telecommunications technology, etc. The RF system 10 may be implemented in a wireless communications device (e.g., mobile phone, tablet, wearable device, etc.) supporting multiple RF systems. In this embodiment, there may be another RF system 20 in the same electronic device 30, where the RF system 20 may comply with a second wireless communications specification such as a wireless fidelity (Wi-Fi) standard, Bluetooth (BT) standard, etc. It should be noted that, in an alternative design, the frequency synthesizer 100 may be used by the RF system 10 implemented in a wireless communications device (e.g., mobile phone, tablet, wearable device, etc.) supporting a single RF system only. In this case, the RF system 20 shown in FIG. 1 may be omitted.

As shown in FIG. 1, the RF system 10 may include a frequency synthesizer 100, a power amplifier 101, a local oscillator (LO) generation block 105, and a transmission (TX) block 106. In this embodiment, the frequency synthesizer 100 may include a PLL 102 and a loop bandwidth controller 104. The PLL 102 may be configured to generate an output clock $CLK_{RF}$ according to a reference clock $CLK_{REF}$. For example, the reference clock $CLK_{REF}$ may be a baseband reference clock which may be stable against the RF injection pulling/pushing caused by the RF aggressors, such as power amplifier 101 and/or the RF system 20; and the output clock $CLK_{RF}$ may be an RF clock needed by the LO generation block 105 for generating an RF carrier signal LO to the TX block 106. The TX block 106 may further receive a baseband input, including an in-phase signal $I_{BB}$ and a quadrature signal $Q_{BB}$, and performs an up-conversion operation upon the baseband input based on the RF carrier signal LO to thereby generate an RF output signal RF_OUT to the power amplifier 101 for signal transmission over the air.

A frequency synthesizer (e.g., frequency synthesizer 100) and a power amplifier (e.g., power amplifier 101) of the same RF system may be integrated in a single chip for achieving a compact size of the RF system. As a result, the RF injection pulling/pushing caused by the power amplifier may degrade the performance of the frequency synthesizer. Further, when multiple RF systems are implemented in the same electronic device, the RF injection pulling/pushing caused by one RF system may degrade the performance of the frequency synthesizer in another RF system. The present invention proposes using the loop bandwidth controller 104 to achieve injection pulling/pushing suppression/mitigation.

The loop bandwidth controller 104 is coupled to the PLL 102, and may be configured to check at least one indicator indicative of injection pulling/pushing of the PLL 102 to configure a loop bandwidth $f_0$ of the PLL 102 for injection pulling/pushing suppression/mitigation. For example, the PLL 102 may include a loop filter 103, and the loop bandwidth controller 104 may set the loop bandwidth $f_0$ of the PLL 102 by controlling a configuration of the loop filter 103 in response to magnitude of the injection pulling/pushing. The adjustable loop filter configuration may include at least one of a filter coefficient setting (e.g., tap coefficient (s) of a filter), a filter type (e.g., a finite impulse response (FIR) filter or an infinite impulse response (IIR) filter), a filter order (e.g., a first-order filter, a second-order filter, or a higher-order filter), and a filter gain. It should be noted that the loop filter 103 may be an analog filter or a digital filter, depending upon the actual architecture of the PLL 102. Further, adjusting the configuration of the loop filter 103 to change the loop bandwidth $f_0$ of the PLL 102 is merely one embodiment of the present invention. Any component in the PLL 102 that can affect the loop bandwidth $f_0$ of the PLL 102 may be configured by the loop bandwidth controller 104 to achieve the desired injection pulling/pushing suppression/mitigation. For another example, the PLL 102 may have no loop filter included therein, and the loop bandwidth controller 104 may set the loop bandwidth $f_0$ of the PLL 102 by controlling a gain value of the PLL 102 in response to magnitude of the injection pulling/pushing. These alternative designs all fall within the scope of the present invention.

By way of example, but not limitation, the at least one indicator checked by the loop bandwidth controller 104 may include an indicator S1 from the PLL 102, an indicator S2 from the RF system 20, and/or an indicator S3 from a physical layer (i.e., layer 1) associated with the RF system 10. In a first exemplary design, the loop bandwidth controller 104 may control the loop bandwidth $f_0$ of the PLL 102 according to only one of the indicators S1, S2 and S3. In a second exemplary design, the loop bandwidth controller 104 may control the loop bandwidth $f_0$ of the PLL 102 according to multiple indicators selected from the indicators S1, S2 and S3.

The above is for illustrative purposes only. In an alternative design, other indicator(s) indicative of injection pulling/pushing of the PLL 102 may be referenced by the loop bandwidth controller 104 for configuring the loop bandwidth $f_0$ of the PLL 102. That is, any PLL-based frequency synthesizer that checks the current status of injection pulling/pushing to control the loop bandwidth $f_0$ of the PLL 102 for injection pulling/pushing suppression/mitigation falls within the scope of the present invention.

For better understanding of technical features of the present invention, an example of a frequency synthesizer with injection pulling/pushing suppression/mitigation is detailed as below.

Figure 2:
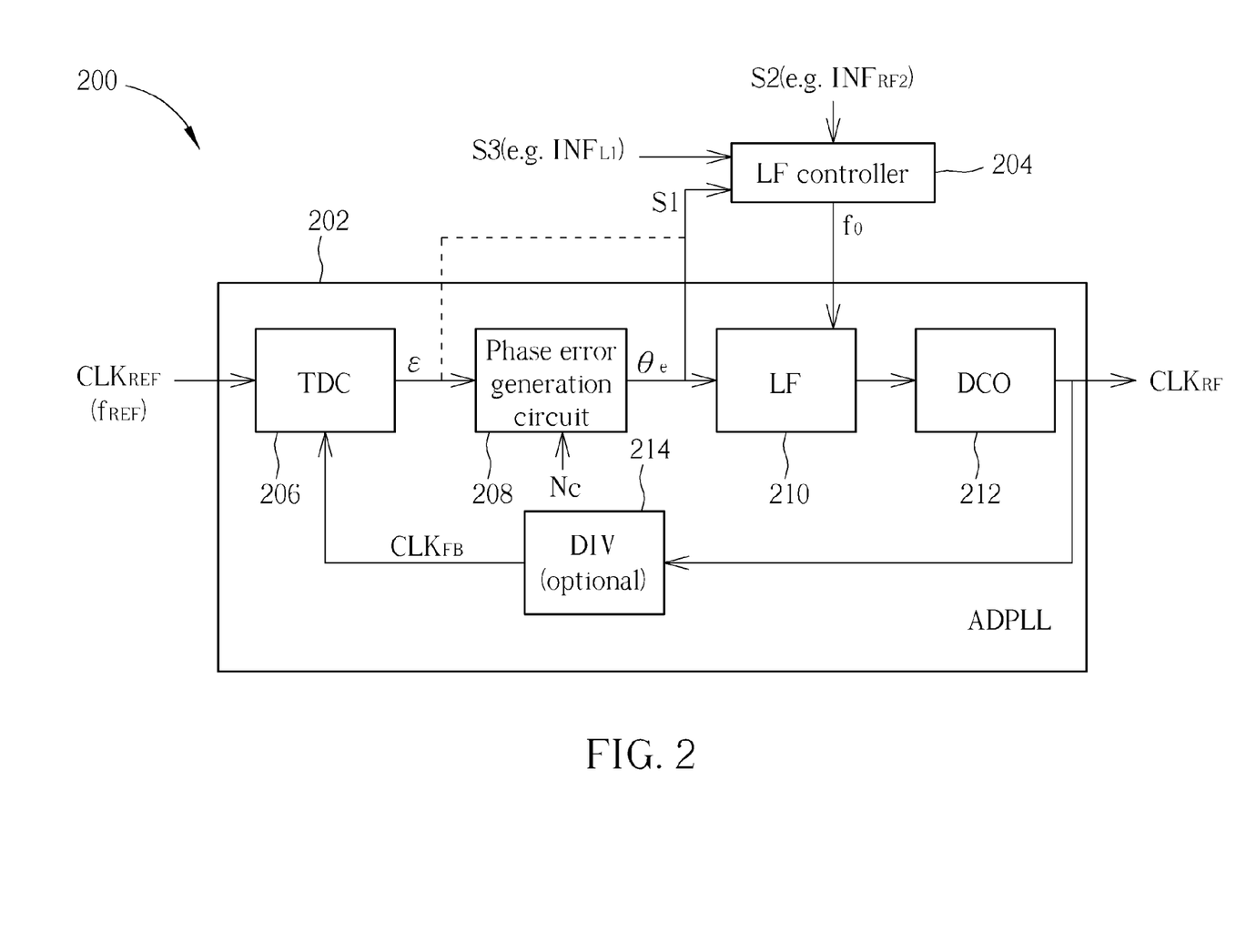
FIG. 2 is a diagram illustrating a frequency synthesizer according to an embodiment of the present invention.

Please refer to FIG. 2, which is a diagram illustrating a frequency synthesizer according to an embodiment of the present invention. The frequency synthesizer 100 in FIG. 1 may be implemented using the frequency synthesizer 200 in FIG. 2. Specifically, the frequency synthesizer 200 may employ the architecture of the frequency synthesizer 100 in FIG. 1. In this embodiment, the frequency synthesizer 200 may include an all-digital phase-locked loop (ADPLL) acting as the PLL 102 in FIG. 1 and a loop filter controller 204 acting as the loop bandwidth controller 104 in FIG. 1. The ADPLL 202 may include a time-to-digital converter (TDC) 206, a phase error generation circuit 208, a loop filter (LF) 210, a digitally controlled oscillator (DCO) 212, and an optional frequency divider (denoted as "DIV") 214. The TDC 206 may receive a reference clock $CLK_{REF}$ with a fixed frequency $f_{REF}$ (e.g., 26 MHz) and a feedback clock $CLK_{FB}$ derived from an output clock $CLK_{RF}$ of the ADPLL 202. In a case where the ADPLL 202 is configured to employ a first ADPLL structure, the frequency divider 214 may be placed in a feedback path between the DCO 212 and the TDC 206. Hence, the feedback clock $CLK_{FB}$ is a frequency-divided clock generated from the output clock $CLK_{RF}$. In another case where the ADPLL 202 is configured to employ a second ADPLL structure, the frequency divider 214 may be omitted. Hence, the output clock $CLK_{RF}$ directly serves as the feedback clock $CLK_{FB}$. After receiving the reference clock $CLK_{REF}$ and the feedback clock $CLK_{FB}$, the TDC 206 may be configured to generate a digital code $\epsilon$ of a time difference between the reference clock $CLK_{REF}$ and the feedback clock $CLK_{FB}$.

The phase error generation circuit 208 may receive RF channel number (s), and may be configured to generate an instantaneous phase error $\theta_e$ according to the digital code $\epsilon$ and a selected RF channel number Nc, where Nc=$CLK_{RF}$ frequency/baseband clock frequency. The phase error generation circuit 208 may refer to the selected RF channel number Nc to decide the phase error of the desired output clock $CLK_{RF}$. The phase error generation circuit 208 may include any circuit components needed to convert the digital code $\epsilon$ into the instantaneous phase error $\theta_e$. As a person skilled in the pertinent art should readily understand details of generating the instantaneous phase error $\theta_e$, further description is omitted here for brevity.

The LF 210 may generate a digital control value to the DCO 212 according to the phase error $\theta_e$. Next, the DCO 212 may control the clock frequency of the output clock $CLK_{RF}$ in response to the digital control value generated from the LF 210. It should be noted that the phase error generation circuit 208 and the LF 210 may operate in a digital domain. Therefore, the LF 210 may be a digital loop filter.

In this embodiment, the LF controller 204 may be configured to act as a loop bandwidth controller of the ADPLL 202, and may be used to set the loop bandwidth $f_0$ of the ADPLL 202 based on at least one of indicators S1, S2 and S3. In a first exemplary design, the indicator S1 from the ADPLL 202 may be referenced by the LF controller 204 for detecting occurrence of the RF injection pulling/pushing and/or measuring the magnitude of the RF injection pulling/pushing. For one example, the LF controller 204 may obtain the indicator S1 based on an output of the phase error generation circuit 208. Since the instantaneous phase error $\theta_e$ may be positively correlated to the magnitude of the RF injection pulling/pushing, the instantaneous phase error $\theta_e$ may be involved in the RF injection pulling/pushing measurement performed by the LF controller 204. For example, when the ADPLL 202 employs Type-I PLL architecture and the instantaneous phase error $\theta_e$ has a significant change (e.g., a large error variation), this may indicate that occurrence of RF injection pulling/pushing is positive, i.e., the DCO 212 is suffering from the RF injection pulling/pushing now. For another example, when the ADPLL 202 employs Type-II PLL architecture and the instantaneous phase error $\theta_e$ has a large absolute value (e.g., a large error magnitude), this may indicate that occurrence of RF injection pulling/pushing is positive, i.e., the DCO 212 is suffering from the RF injection pulling/pushing now. In short, the magnitude (for type-II PLL) or variation (for type-I PLL) of instantaneous phase error may be positively correlated to the magnitude of the RF injection pulling/pushing. At this moment, the magnitude of the RF injection pulling/pushing may be measured based on the output of the phase error generation circuit 208. It should be noted that, based on the actual design consideration, the instantaneous phase errors $\theta_e$ obtained at different time points may be directly used for RF injection pulling/pushing detection and measurement, or may be processed (e.g., filtered or averaged) before used for RF injection pulling/pushing detection and measurement. That is, the present invention has no limitation on how the instantaneous phase error $\theta_e$ is used for RF injection pulling/pushing detection and measurement.

Alternatively, the LF controller 204 may obtain the indicator S1 based on an output of the TDC 206. Since the digital code $\epsilon$ represents the time difference between the reference clock $CLK_{REF}$ and the feedback clock $CLK_{FB}$ (which is derived from the output clock $CLK_{RF}$ generated from the DCO 212), the digital information available at the TDC output may reflect the current status of the RF injection pulling/pushing. Hence, the digital code $\epsilon$ may be involved in the RF injection pulling/pushing detection and measurement performed by the LF controller 204. Similarly, based on the actual design consideration, the digital codes $\epsilon$ obtained at different time points may be directly used for RF injection pulling/pushing detection and measurement, or may be processed (e.g., filtered or averaged) before used for RF injection pulling/pushing detection and measurement. That is, the present invention has no limitation on how the digital code $\epsilon$ is used for RF injection pulling/pushing detection and measurement.

In a second exemplary design, the indicator S2 from another RF system may be referenced by the LF controller 204 for detecting occurrence of the RF injection pulling/pushing. For example, the LF controller 204 may obtain the indicator S2 based on an operational status $INF_{RF2}$ of a second RF system (e.g., RF system 20 in FIG. 1) different from a first RF system (e.g., RF system 10) in which the frequency synthesizer 200 is implemented. When the operational status $INF_{RF2}$ indicates that the second RF system (e.g., a Wi-Fi transceiver) is powered on or operated in a normal mode, the LF controller 204 may judge that the occurrence of the RF injection pulling/pushing is positive; and when the operational status $INF_{RF2}$ indicates that the second RF system (e.g., a Wi-Fi transceiver) is powered off or operated in a sleep mode, the LF controller 204 may judge that the occurrence of the RF injection pulling/pushing is negative.

In a third exemplary design, the indicator S3 from the physical layer may be referenced by the LF controller 204 for detecting occurrence of the RF injection pulling/pushing and/or measuring the magnitude of the RF injection pulling/pushing. For example, the LF controller 204 may obtain the indicator S3 based on layer-one information $INF_{L1}$ of a transmit power of an RF system (e.g., RF system 10) in which the frequency synthesizer 200 is implemented. Specifically, the physical layer (i.e., layer 1) provides information of a transmit power designed for signal transmission. Thus, when the layer-one information $INF_{L1}$ indicates that the transmit power is high, the output power of a power amplifier (e.g., power amplifier 101 in FIG. 1) may introduce large RF injection pulling/pushing to the DCO 212; and when the layer-one information $INF_{L1}$ indicates that the transmit power is low, the output power of the power amplifier (e.g., power amplifier 101 in FIG. 1) may introduce small or negligible RF injection pulling/pushing to the DCO 212. In other words, the transmit power may be positively correlated to the magnitude of the RF injection pulling/pushing.

Figure 3:
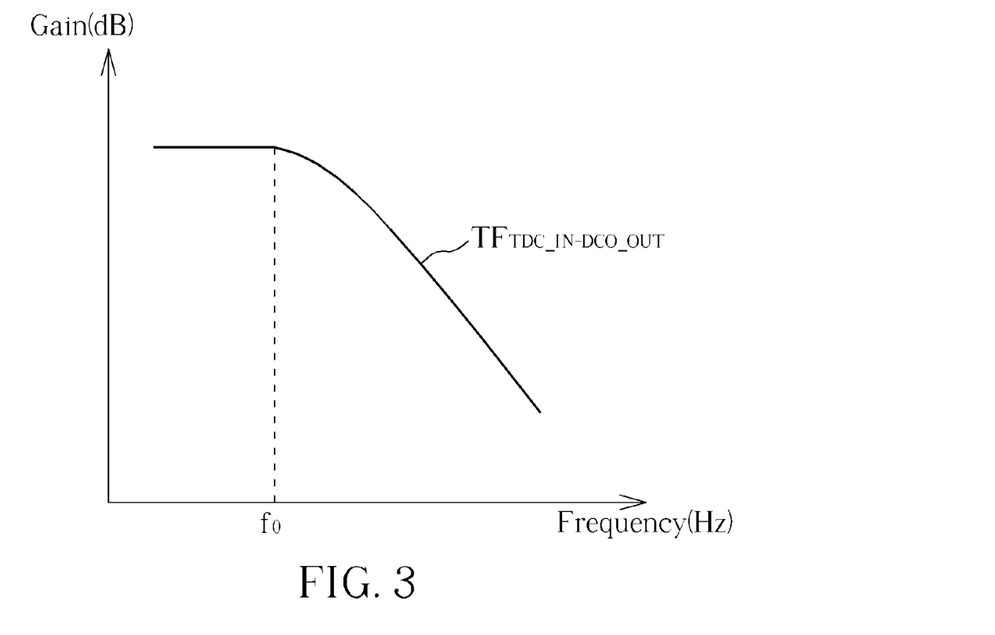
FIG. 3 is a diagram illustrating a closed-loop transfer function from a TDC input to a DCO output.
Figure 4:
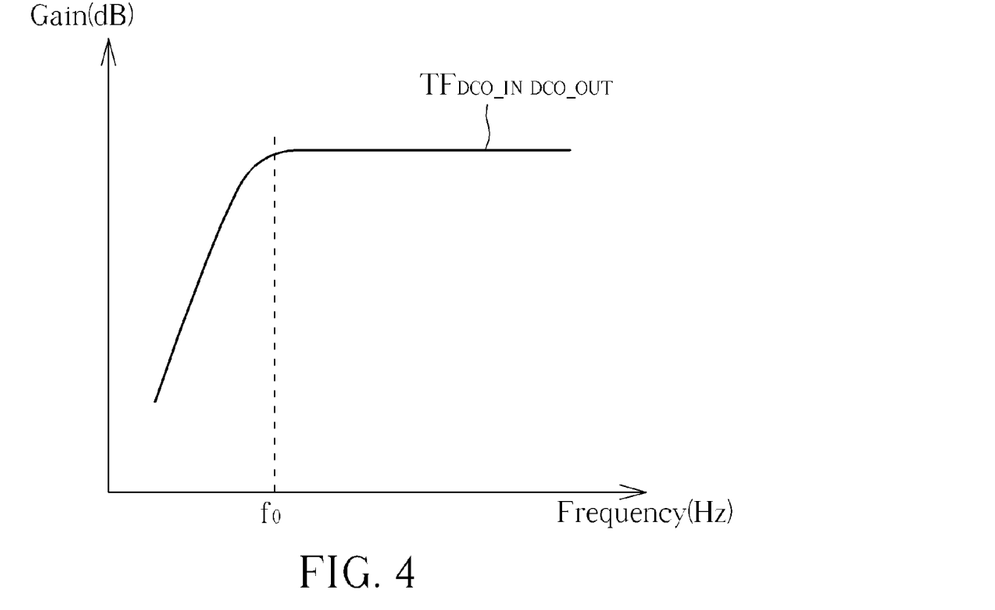
FIG. 4 is a diagram illustrating a closed-loop transfer function from a DCO input to a DCO output.

Please refer to FIG. 3 in conjunction with FIG. 4. The closed-loop transfer function $TF_{TDC\_IN-DCO\_OUT}$ from the TDC input to the DCO output may be low pass, while the closed-loop transfer function $TF_{DCO\_IN-DCO\_OUT}$ from the DCO input to the DCO output may be high pass. Hence, the TDC noise may be low-pass filtered by the ADPLL, and the DCO noise may be high-pass filtered by the ADPLL. The low pass corner frequency and the high pass corner frequency may both be set by the loop bandwidth $f_0$ of the ADPLL. Since the RF pulling/pushing may be injected into the DCO 212, the loop bandwidth $f_0$ of the ADPLL 202 may be adjusted to change the corner frequency of the closed-loop transfer function $TF_{DCO\_IN-DCO\_OUT}$, thus suppressing/mitigating the RF injection pulling/pushing. It should be noted that adjusting the loop bandwidth $f_0$ of the ADPLL 202 may also change the corner frequency of the closed-loop transfer function $TF_{TDC\_IN-DCO\_OUT}$. However, compared to the DCO noise resulting from RF injection pulling/pushing, the TDC noise has a less serious impact on the quality of the output clock $CLK_{RF}$ of the ADPLL 202. Hence, when the RF injection pulling/pushing occurs, the quality of the output clock $CLK_{RF}$ of the ADPLL 202 may be effectively improved by adjusting the loop bandwidth $f_0$ of the ADPLL 202 to suppress/mitigate the undesired RF injection pulling/pushing.

Based on above observation, the LF controller 204 may employ a proposed adaptive injection pulling/pushing suppression/mitigation scheme to adjust the loop bandwidth $f_0$ of the ADPLL 202 in response to a current status of the RF injection pulling/pushing. In this embodiment, the LF controller 204 may adjust the loop bandwidth $f_0$ of the ADPLL 202 by controlling a configuration of LF 210, where the filter configuration may include at least one of a filter coefficient setting, a filter type, a filter order, and a filter gain.

Figure 5:
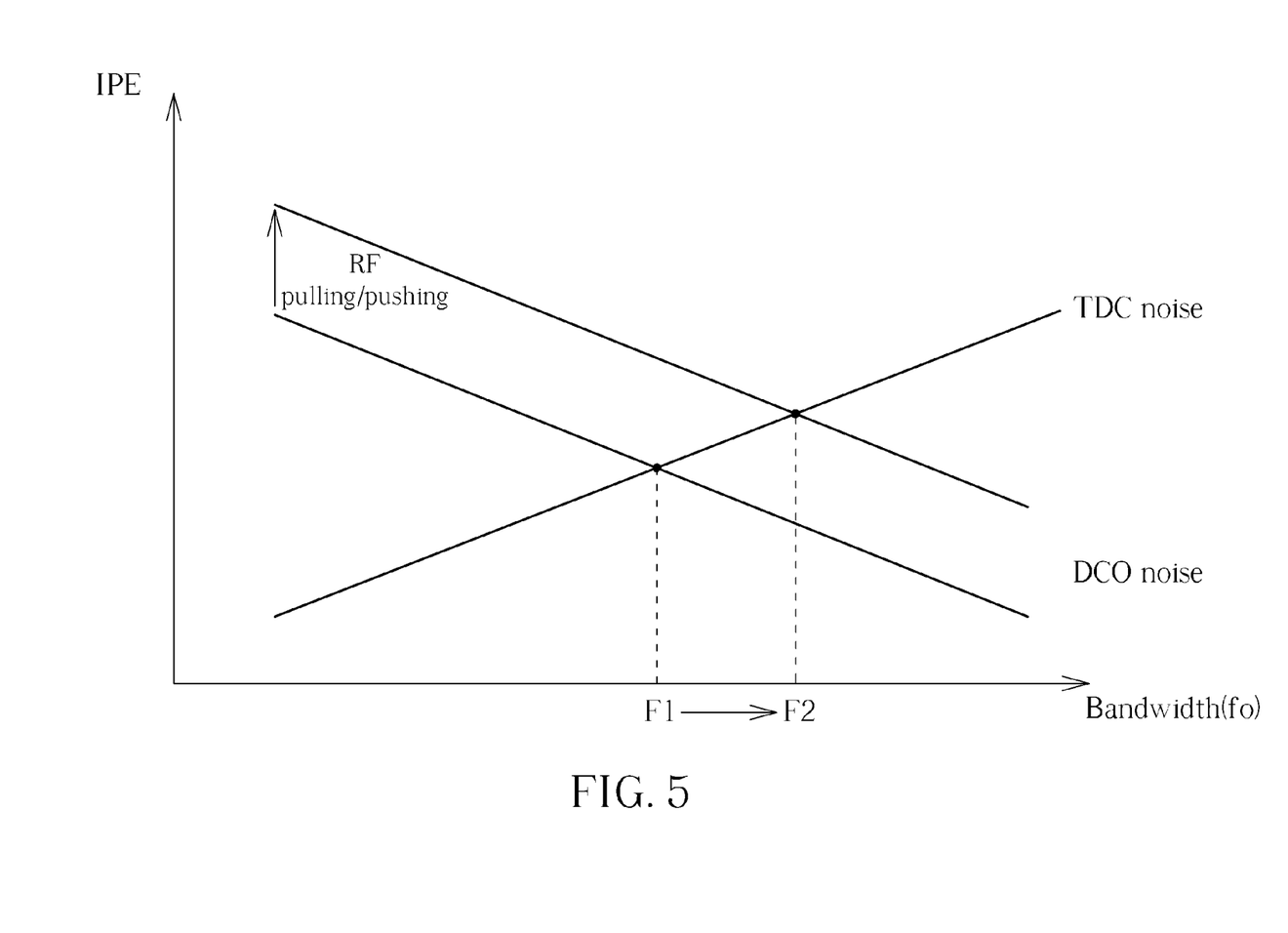
FIG. 5 is a diagram illustrating an adaptive injection pulling/pushing suppression/mitigation scheme according to an embodiment of the present invention.

Please refer to FIG. 5, which is a diagram illustrating an adaptive injection pulling/pushing suppression/mitigation scheme according to an embodiment of the present invention. When the at least one indicator S1/S2/S3 indicates that occurrence of the RF injection pulling/pushing of the ADPLL 202 is negative, the LF controller 204 (which may act as a loop bandwidth controller) may set the loop bandwidth $f_0$ of the ADPLL 202 by a first value F1. More specifically, a nominal PLL bandwidth may be employed when there is no RF injection pulling/pushing. However, when the RF injection pulling/pushing occurs, the DCO noise curve in FIG. 5 may be shifted upwards, resulting in larger integrated phase noise (IPE). Hence, when at least one indicator S1/S2/S3 indicates that occurrence of the RF injection pulling/pushing of the ADPLL 202 is positive, the LF controller 204 (which may act as a loop bandwidth controller) may set the loop bandwidth $f_0$ of the ADPLL 202 by a second value F2 larger than the first value F1, thereby enhancing the suppression of the DCO noise. More specifically, when there is RF injection pulling/pushing, a larger PLL bandwidth may be employed for injection pulling/pushing suppression/mitigation.

Further, the LF controller 204 may set the loop bandwidth $f_0$ of the ADPLL 202 by different values according to different RF injection pulling/pushing magnitudes. Specifically, the LF controller 204 (which may act as a loop bandwidth controller) may be configured to increase the loop bandwidth $f_0$ of the ADPLL 202 when the at least one indicator S1/S2/S3 indicates that the RF injection pulling/pushing of the ADPLL 202 is increased, and may be configured to decrease the loop bandwidth $f_0$ of the ADPLL 202 when the at least one indicator S1/S2/S3 indicates that the RF injection pulling/pushing of the ADPLL 202 is decreased.

Figure 6:
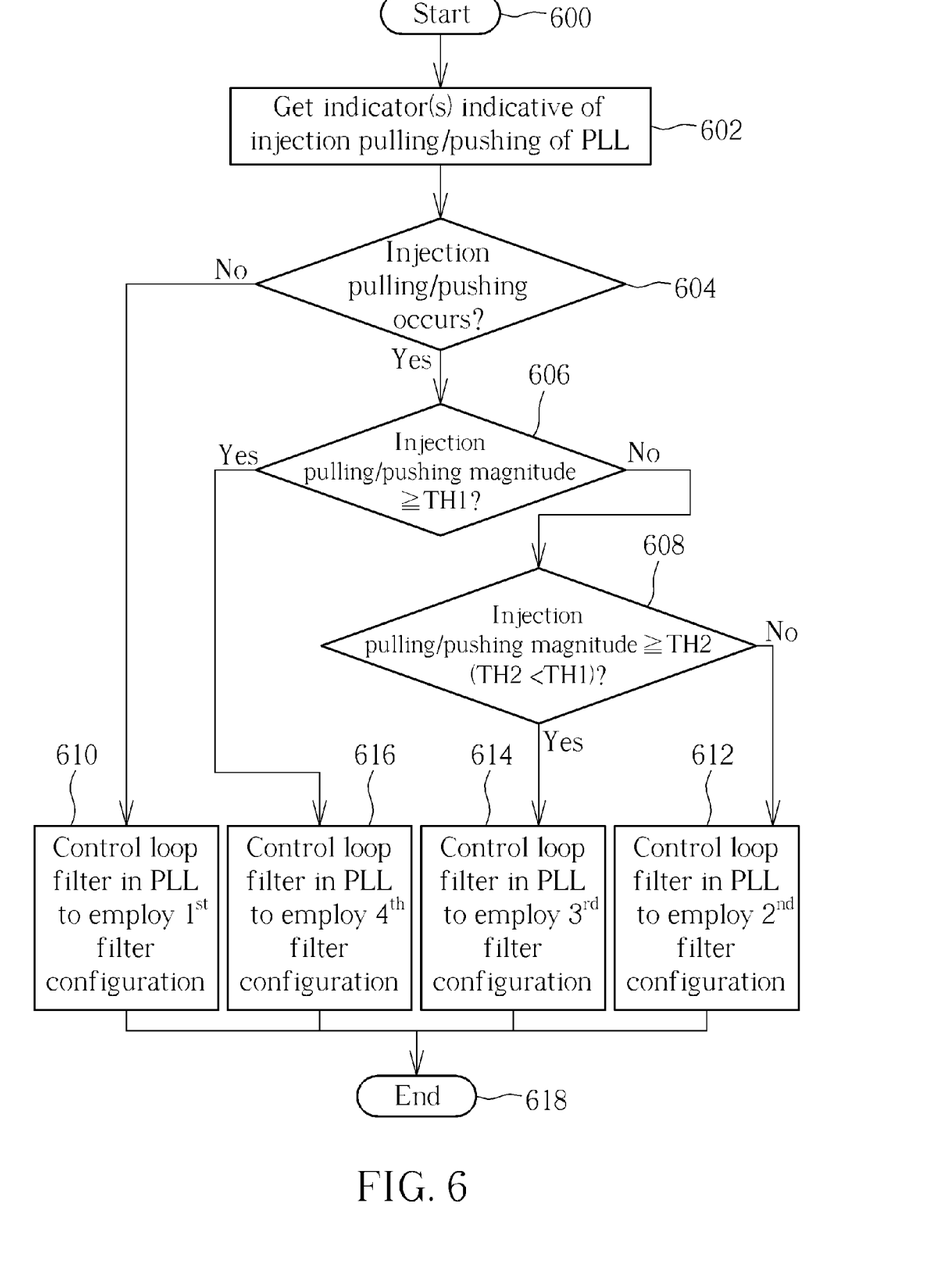
FIG. 6 is a flowchart illustrating an adaptive injection pulling/pushing suppression/mitigation method according to an embodiment of the present invention.

FIG. 6 is a flowchart illustrating an adaptive injection pulling/pushing suppression/mitigation method according to an embodiment of the present invention. Provided that the result is substantially the same, the steps are not required to be executed in the exact order shown in FIG. 6. Besides, according to different design requirements, one or more steps shown in FIG. 6 may be omitted and/or one or more steps may be added to the flow shown in FIG. 6. The adaptive injection pulling/pushing suppression/mitigation method may be employed by the frequency synthesizer 100/200, and may be briefly summarized as below.

Step 600: Start.

Step 602: Get at least one indicator indicative of injection pulling/pushing of a phase-locked loop (PLL).

Step 604: Determine if injection pulling/pushing of the PLL occurs by checking the at least one indicator. If yes, go to step 606; otherwise, go to step 610.

Step 606: Check if the magnitude of the injection pulling/pushing is not less than a first threshold TH1. If yes, go to step 616; otherwise, go to step 608.

Step 608: Check if the magnitude of the injection pulling/pushing is not less than a second threshold TH2 (TH2<TH1). If yes, go to step 614; otherwise, go to step 612.

Step 610: Control a loop filter in the PLL to employ a first filter configuration corresponding to a first loop bandwidth value of the PLL. Go to step 618.

Step 612: Control a loop filter in the PLL to employ a second filter configuration corresponding to a second loop bandwidth value of the PLL, where the second loop bandwidth value is larger than the first loop bandwidth value. Go to step 618.

Step 614: Control a loop filter in the PLL to employ a third filter configuration corresponding to a third loop bandwidth value of the PLL, where the third loop bandwidth value is larger than the second loop bandwidth value. Go to step 618.

Step 616: Control a loop filter in the PLL to employ a fourth filter configuration corresponding to a fourth loop bandwidth value of the PLL, where the fourth loop bandwidth value is larger than the third loop bandwidth value.

Step 618: End.

It should be noted that the adaptive injection pulling/pushing suppression/mitigation method shown in FIG. 6 is for illustrative purposes only. For example, the number of different filter configurations supported by the loop filter in the PLL is not limited to 4. Similarly, the number of threshold values used for classifying magnitude values of injection pulling/pushing is not limited to 2. Specifically, any PLL-based frequency synthesizer design with a loop bandwidth that is adaptively adjusted in response to a current status of injection pulling/pushing would fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency synthesizer, comprising:
   a phase-locked loop (PLL), configured to generate an output clock according to a reference clock; and
   a loop bandwidth controller, configured to check at least one indicator indicative of injection pulling/pushing of the PLL to configure a loop bandwidth of the PLL, wherein the loop bandwidth controller is configured to increase the loop bandwidth of the PLL when the at least one indicator indicates that the injection pulling/pushing of the PLL is increased, and decrease the loop bandwidth of the PLL when the at least one indicator indicates that the injection pulling/pushing of the PLL is decreased.

2. The frequency synthesizer of claim 1, wherein the PLL includes a loop filter, and the loop bandwidth controller configures the loop bandwidth of the PLL by controlling a configuration of the loop filter.

3. The frequency synthesizer of claim 2, wherein the configuration of the loop filter comprises at least one of a filter coefficient setting, a filter type, a filter order, and a filter gain.

4. The frequency synthesizer of claim 2, wherein the PLL is an all-digital phase-locked loop (ADPLL), and the loop filter is a digital loop filter of the ADPLL.

5. The frequency synthesizer of claim 1, wherein the PLL is an all-digital phase-locked loop (ADPLL), the ADPLL comprises a time-to-digital converter (TDC) configured to generate a digital code of a time difference between the reference clock and a feedback clock derived from the output clock, and the loop bandwidth controller obtains the at least one indicator based on at least an output of the TDC.

6. The frequency synthesizer of claim 1, wherein the PLL is an all-digital phase-locked loop (ADPLL), the ADPLL comprises a phase error generation circuit configured to generate an instantaneous phase error according to a digital code of a time difference between the reference clock and a feedback clock derived from the output clock, and the loop bandwidth controller obtains the at least one indicator based on at least an output of the phase error generation circuit.

7. The frequency synthesizer of claim 1, wherein the frequency synthesizer is part of a radio-frequency (RF) system, and the loop bandwidth controller obtains the at least one indicator based on at least information of a transmit power of the RF system.

8. The frequency synthesizer of claim 1, wherein the frequency synthesizer is part of a first radio-frequency (RF) system, and the loop bandwidth controller obtains the at least one indicator based on at least an operational status of a second RF system.

9. The frequency synthesizer of claim 1, wherein the loop bandwidth controller is configured to set the loop bandwidth of the PLL by a first value when the at least one indicator indicates that occurrence of the injection pulling/pushing of the PLL is negative, and set the loop bandwidth of the PLL by a second value when the at least one indicator indicates that the occurrence of the injection pulling/pushing of the PLL is positive, where the second value is larger than the first value.

10. The frequency synthesizer of claim 1, wherein the PLL has no loop filter, and the loop bandwidth controller configures the loop bandwidth of the PLL by controlling a gain value of the PLL.

11. A frequency synthesizing method, comprising:
checking at least one indicator indicative of injection pulling/pushing of a phase-locked loop (PLL) for configuring a loop bandwidth of the PLL, wherein when the at least one indicator indicates that the injection pulling/pushing of the PLL is increased, increasing the loop bandwidth of the PLL; and when the at least one indicator indicates that the injection pulling/pushing of the PLL is decreased, decreasing the loop bandwidth of the PLL; and
utilizing the PLL to generate an output clock according to a reference clock.

12. The frequency synthesizing method of claim 11, wherein the PLL includes a loop filter, and the step of configuring the loop bandwidth of the PLL comprises:
setting the loop bandwidth of the PLL by controlling a configuration of the loop filter.

13. The frequency synthesizing method of claim 12, wherein the configuration of the loop filter comprises at least one of a filter coefficient setting, a filter type, a filter order, and a filter gain.

14. The frequency synthesizing method of claim 12, wherein the PLL is an all-digital phase-locked loop (AD-PLL), and the loop filter is a digital loop filter of the ADPLL.

15. The frequency synthesizing method of claim 11, wherein the PLL is an all-digital phase-locked loop (AD-PLL), the ADPLL comprises a time-to-digital converter (TDC) configured to generate a digital code of a time difference between the reference clock and a feedback clock derived from the output clock, and the frequency synthesizing method further comprises:
obtaining the at least one indicator based on at least an output of the TDC.

16. The frequency synthesizing method of claim 11, wherein the PLL is an all-digital phase-locked loop (AD-PLL), the ADPLL comprises a phase error generation circuit configured to generate an instantaneous phase error according to a digital code of a time difference between the reference clock and a feedback clock derived from the output clock, and the frequency synthesizing method further comprises:
obtaining the at least one indicator based on at least an output of the phase error generation circuit.

17. The frequency synthesizing method of claim 11, wherein the PLL is part of a radio-frequency (RF) system, and the frequency synthesizing method further comprises:
obtaining the at least one indicator based on at least information of a transmit power of the RF system.

18. The frequency synthesizing method of claim 11, wherein the PLL is part of a first radio-frequency (RF) system, and the frequency synthesizing method further comprises:
obtaining the at least one indicator based on at least an operational status of a second RF system.

19. The frequency synthesizing method of claim 11, wherein the step of checking the at least one indicator indicative of the injection pulling/pushing of the PLL for configuring the loop bandwidth of the PLL comprises:
when the at least one indicator indicates that occurrence of the injection pulling/pushing of the PLL is negative, setting the loop bandwidth of the PLL by a first value; and
when the at least one indicator indicates that the occurrence of the injection pulling/pushing of the PLL is positive, setting the loop bandwidth of the PLL by a second value, wherein the second value is larger than the first value.

20. The frequency synthesizing method of claim 11, wherein the PLL has no loop filter, and the step of configuring the loop bandwidth of the PLL comprises:
setting the loop bandwidth of the PLL by controlling a gain value of the PLL.

* * * * *